US007015709B2

(12) United States Patent
Capps et al.

(10) Patent No.: US 7,015,709 B2
(45) Date of Patent: Mar. 21, 2006

(54) ULTRA-BROADBAND DIFFERENTIAL VOLTAGE PROBES

(75) Inventors: Charles P. Capps, Carmel, IN (US); Brian W. Johnson, Kokomo, IN (US); Jeffrey M. Gloudemans, Kokomo, IN (US); John A. Lane, Tipton, IN (US)

(73) Assignee: Delphi Technologies, Inc., Troy, MI (US)

( * ) Notice: Subject to any disclaimer, the term of this patent is extended or adjusted under 35 U.S.C. 154(b) by 51 days.

(21) Appl. No.: 10/843,775

(22) Filed: May 12, 2004

(65) Prior Publication Data

US 2005/0253603 A1 Nov. 17, 2005

(51) Int. Cl.
*G01R 31/02* (2006.01)
*G01R 1/06* (2006.01)

(52) U.S. Cl. ................. 324/754; 324/158.1; 324/72.5; 324/149

(58) Field of Classification Search ............... 324/754, 324/750–765
See application file for complete search history.

(56) References Cited

U.S. PATENT DOCUMENTS

| | | | | |
|---|---|---|---|---|
| 4,978,907 A | | 12/1990 | Smith .......................... | 324/72.5 |
| 5,172,051 A | | 12/1992 | Zamborelli .................. | 324/72.5 |
| 6,037,787 A | * | 3/2000 | Corwith ....................... | 324/754 |
| 6,362,614 B1 | * | 3/2002 | Draving ...................... | 324/72.5 |
| 6,362,635 B1 | * | 3/2002 | Draving et al. ............. | 324/754 |
| 6,373,348 B1 | | 4/2002 | Hagerup ................... | 333/81 A |
| 6,384,614 B1 | * | 5/2002 | Hager et al. ................. | 324/754 |
| 6,407,562 B1 | | 6/2002 | Whiteman .................... | 324/754 |
| 2002/0121907 A1 | | 9/2002 | Griessbaum et al. ........ | 324/642 |
| 2004/0085057 A1 | * | 5/2004 | McTigue .................... | 324/72.5 |

OTHER PUBLICATIONS

Sekel, Steve, Differential Oscilloscope Measurements A Primer on Differential Measurements, Types of Amplifiers, Applications, and Avoiding Common Errors, Tektronix, In., 1996, pp. 1-16, Textronix Publications, USA.

Smith, Douglas C., Balanced Prode Extends High-Frequency Measurements, IEEE Circuites & Devices, The Magazine of Electronic and Photonic Systems, Nov. 1994, pp. 19-21, vol. 10, No. 6, Institute of Electrical and Electronics Engineers, Los Gatos, CA, USA.

Fischer Custom Communications, Inc.; High Performance Differential Voltage Probe. Retrieved from www.fischercc.com.

* cited by examiner

*Primary Examiner*—Robert Pascal
*Assistant Examiner*—Emily Y Chan
(74) *Attorney, Agent, or Firm*—Stefan V. Chmielewski

(57) ABSTRACT

Passive balanced probes are disclosed for use with a signal analysis device. The probes are very low cost relative to typical commercially available probes and provide an extremely flat response over a frequency range of approximately 0 to at least 1.5 gigahertz. The probes include a probe body constructed primarily from conventional components, a first surface mount resistor electrically connected between a probe tip and a center conductor, and two surface mount resistors electrically connected and parallel between the center conductor and a conductive shield. The probes further include a coaxial cable for connection to an instrument combiner or other instrument connection device.

19 Claims, 5 Drawing Sheets

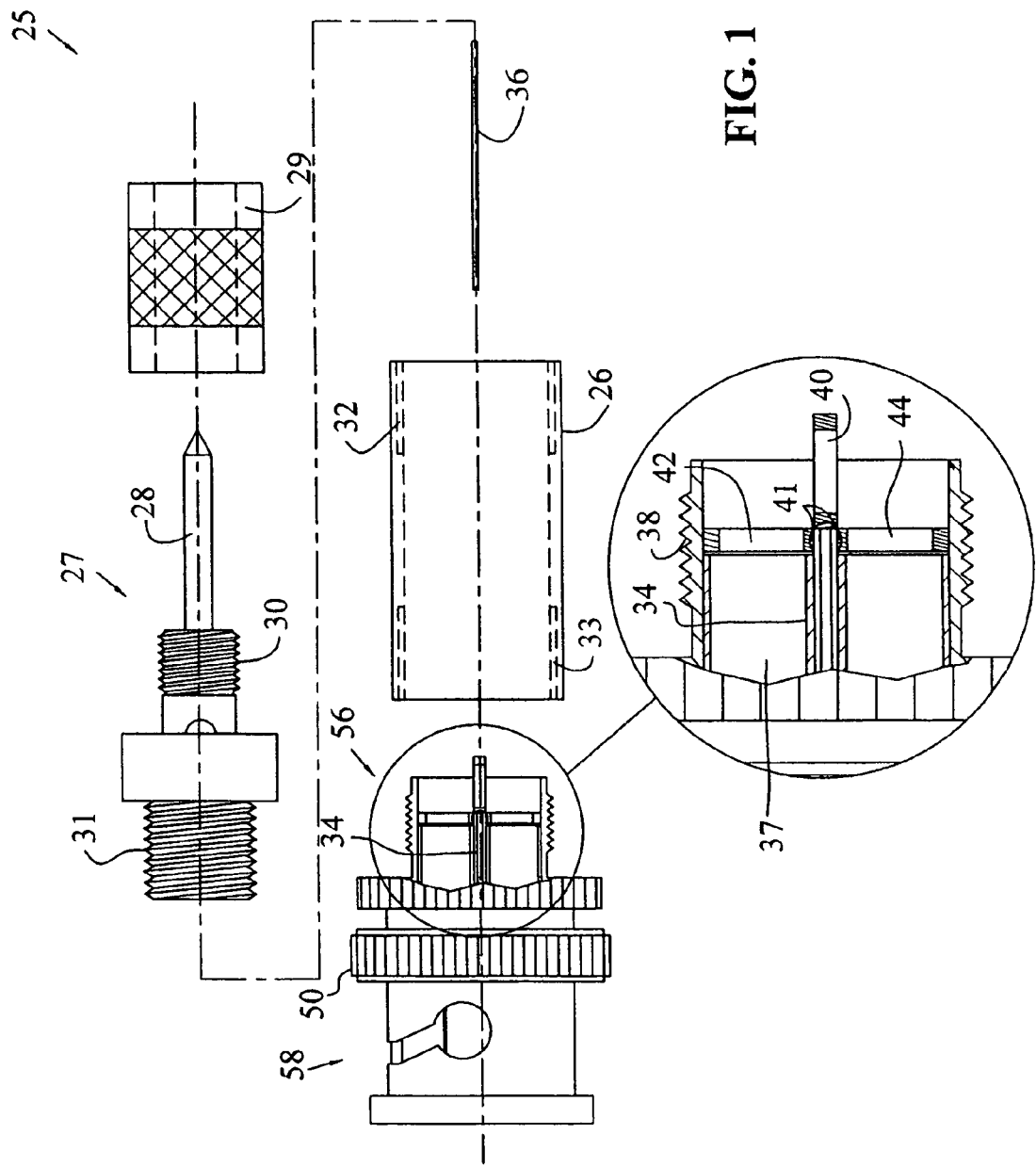

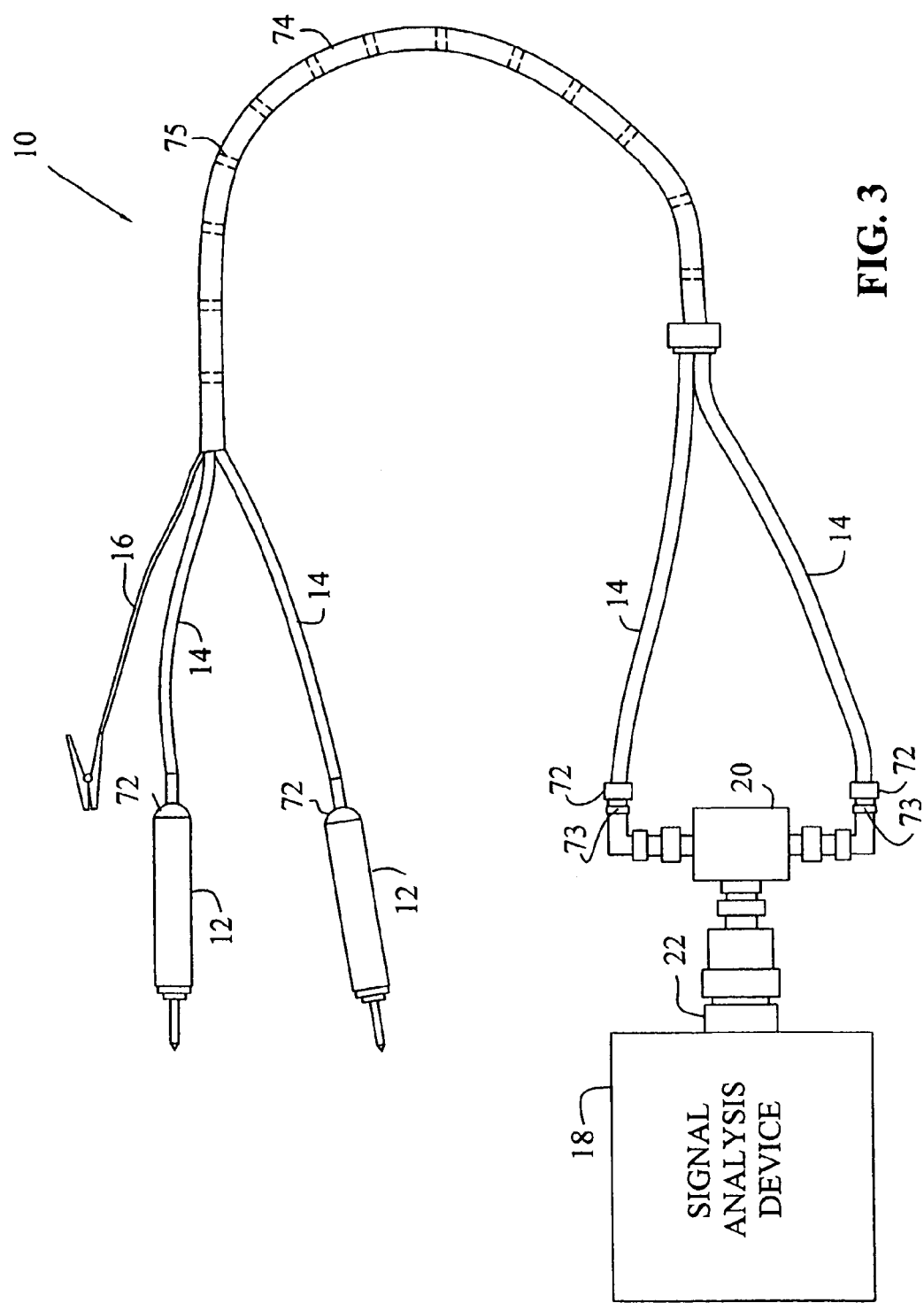

ULTRA-BROADBAND DIFFERENTIAL VOLTAGE PROBES

TECHNICAL BACKGROUND

The present invention generally relates to high frequency measurement equipment, and, more particularly, the invention relates to wideband differential voltage probes.

BACKGROUND OF THE INVENTION

Oscilloscopes, spectrum analyzers, and other signal analysis devices are generally used to measure a voltage signal between two points with one of the points often being referenced to earth ground. However, in many cases it is advantageous to measure the voltage between two points in a circuit with neither of the points being the ground to which the signal analysis device is referenced.

If the ground of the signal analysis device is connected to the ground of the circuit under test, a ground loop may result. The ground loop may act as a secondary transformer winding, thus producing a magnetic field and creating a signal in nearby conductors, such as the probe used to connect the signal analysis device with the circuit under test. Additionally, current and impedance within the ground loop may produce a signal component in the signal analysis device measurement.

Floating the ground of either the circuit under test or the signal analysis device may open the ground loop; however, floating the ground may result in an electrical shock hazard as one of the devices no longer has a connection to ground through which an electrical short could be carried. Additionally, even with a floating ground, high frequency signals may still act as if they were coupled to ground by creating a ground loop with stray capacitance relative to earth ground, for example, capacitance introduced by the operator's hand holding a probe.

Another problem with probes, including high impedance FET probes, relates to input impedance. While some conventional passive probes utilize a high input impedance, for example 10 megohms in parallel with 10 picofarads, such probes are not high impedance at higher frequencies and generally have significant measurement error at higher frequencies because of the resonance generated between the probe's input capacitance and the inductance of a ground lead. This resonance results in a significant reduction in input impedance near the resonant frequency and often introduces ringing on the measurement waveform.

A typical method of overcoming the above problems while measuring the voltage between two circuit nodes is to replace the conventional probe with a passive, predominantly resistive, balanced differential probe pair. A typical commercially available balanced probe pair includes a pair of coaxial cables having a probe end and an output end. The output end of the coaxial cables are generally fed to a 180° combiner in order to provide a differential input into a single oscilloscope channel or spectrum analyzer. However, parasitic capacitances and inductances are critical to probe performance, and typical commercially available balanced probe pairs and lower capacitance FET probes are very expensive, costing between $250.00 to over $2,400.00.

The lower-cost commercially available probes tend to have a limited useful frequency range because of parasitic electrical characteristics. The more expensive probes having improved wideband response are cost prohibitive for many applications.

SUMMARY OF THE INVENTION

The present invention provides passive balanced probes for use with a signal analysis device, for example an oscilloscope or spectrum analyzer. The inventive probes are very low cost relative to typical commercially available probes and provide an extremely flat response over a frequency range of approximately 0 to at least 1.5 gigahertz. The probes include a probe body constructed primarily from conventional radio-frequency ("RF") connector components, and a termination resistive input network, including a first surface mount device ("SMD" or "surface mount") resistor electrically connected between a probe tip and a center conductor, and one or more SMD resistors electrically connected in parallel between the center conductor and a conductive shield end closest to the probe tip. The probes further include coaxial cables for connection to a signal analysis device. For use with signal analysis devices having a single input, such as a spectrum analyzer, the coaxial cables may be connected to a broadband 180° RF combiner.

Each probe in a balanced probe pair includes matched impedance components and is coupled with a matched impedance coaxial cable, for example standard 50 ohm components and coaxial cable; however, other impedance values may alternatively be used, for example, 75 ohms. Additionally, other types of coaxial structures may be substituted for the RF connectors. The outer conductive shields of the coaxial cables are electrically joined along the cable length in order to reduce parasitic inductance. The cables may include a commercially available matched impedance adapter at an end opposite the probes, in order to couple the balanced probe pair to a signal analysis device input or combiner. Use of matched impedance components and component interfaces throughout minimizes standing waves and thus measurement error.

The probe body may also include an outer conductive probe body and a distal probe tip housing supporting a conductive probe tip which protrudes from the probe housing. The probe tip housing may be a non-conductive sleeve housing a center conductor which is electrically coupled through the first SMD resistor to the coaxial cable center conductor. The outer conductive probe body electrically couples the outer shield of the various probe body components to keep impedance low, mechanically stabilizes the probe body, and increases the outer diameter of the probe body in order to minimize stray capacitance introduced by holding the probe. The probe body construction facilitates placement of the termination resistive input network at the very end of the controlled impedance coaxial portion of the probe.

The use of SMD resistors and the location of the SMD resistors minimizes parasitic inductance and capacitance, thereby providing enhanced performance over a wide bandwidth. Specifically, using surface mount components that are soldered to the probe tip and/or center conductor and outer conductor or shield, avoids component leads that typically introduce additional parasitic inductance and capacitance.

Additionally, the use of commercially available connectors, for example coaxial BNC connectors, and other adapters to construct the probe and cable apparatus minimizes the cost of producing an impedance matched and balanced probe pair with a desirable signal-to-noise ratio ("SNR") while not sacrificing the desired performance across a wide frequency range.

A first exemplary embodiment provides a passive test probe apparatus for use with a signal analysis device, including a conductive probe body, a conductive probe tip supported by and protruding from the probe body, a center conductor supported by and substantially electrically insulated from the probe body, and a first surface mount resistor electrically connected between the probe tip and the center conductor.

Another exemplary embodiment provides a balanced test probe apparatus, including a first probe body having a first surface mount resistor electrically connected between a first probe tip and a first center conductor, a first coaxial cable electrically connected to the first probe at a first end, a second probe having a second surface mount resistor connected between a second probe tip and a second center conductor, and a second coaxial cable of substantially equal length with the first coaxial cable, the second coaxial cable electrically connected to the second probe at a second end, the second surface mount resistor having a resistance value equal to the first surface mount resistor.

Yet another exemplary embodiment provides a passive test probe apparatus for use with a signal analysis device, including a probe body, a conductive probe tip supported by and axially protruding from the probe body, a center conductor supported by the probe body, a first surface mount resistor electrically connected between the probe tip and the center conductor, an outer conductive shield coupled to the probe body, the outer shield insulated from the probe tip and the center conductor, and a second and a third surface mount resistor electrically connected in parallel between the center conductor and a distal end of the conductive shield.

Advantageously, the present invention provides a low-cost ultra-broadband probe having an extremely flat response characteristic over a frequency range of approximately 0 to at least 1.5 gigahertz. The probe may be constructed of commercially available components selected and assembled to minimize parasitic inductance and capacitance and to maximize the amount of power carried from the point of measurement to the signal analysis instrument.

BRIEF DESCRIPTION OF THE DRAWINGS

The present invention will now be described, by way of example, with reference to the accompanying drawings, in which:

FIG. 1 is an exploded assembly view of a probe tip according to the present invention;

FIG. 3 is an assembly view of a balanced probe pair according to the present invention, including the probe of FIG. 2A;

Figures 2A, 2B:
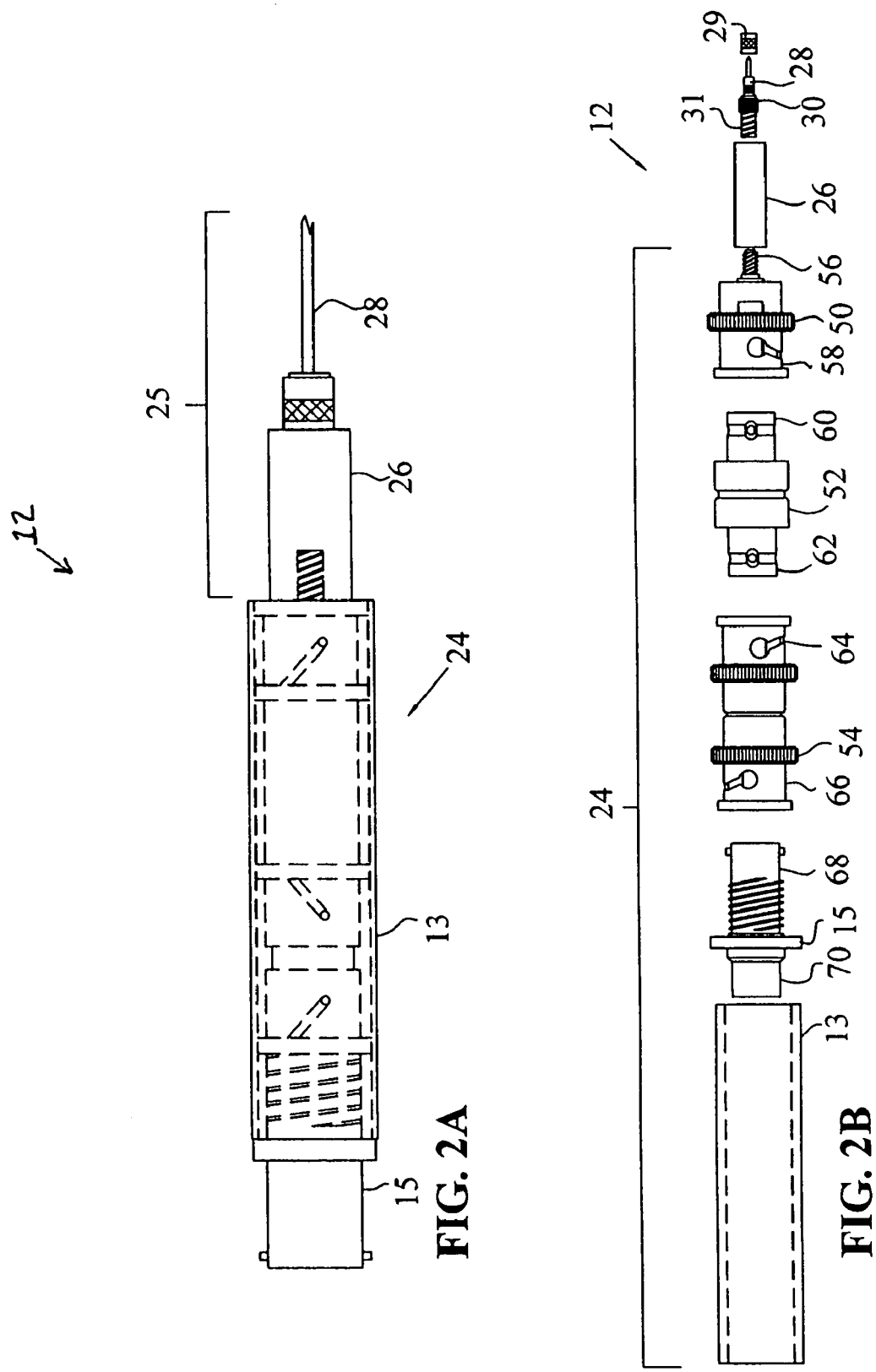
FIG. 2A is an assembly view of a probe according to the present invention.
FIG. 2B is an exploded assembly view of the probe shown in FIG. 2A.

Corresponding reference characters indicate corresponding parts throughout the several views. Although the drawings represent an embodiment of the present invention, the drawings are not necessarily to scale and certain features may be exaggerated in order to better illustrate and explain the present invention. The exemplifications set out herein illustrate an embodiment of the invention and such exemplifications are not to be construed as limiting the scope of the invention in any manner.

DESCRIPTION OF INVENTION

The embodiment disclosed below is not intended to be exhaustive or limit the invention to the precise forms disclosed in the following detailed description. Rather, the embodiment is chosen and described so that others skilled in the art may utilize its teachings.

Referring to FIG. 3, balanced probe pair assembly 10 includes probes 12, coaxial cables 14, and may include ground lead 16. Assembly 10 may be coupled to input channel connector 22 of signal analysis device 18 using, for example, combiner 20. Referring to FIG. 2A, each probe 12 includes probe body 24, probe end 25, body sleeve 13, and base connector 15.

Referring to FIG. 1, each probe end 25 includes a probe tip sleeve 26, a coupling probe end connector 50 and a probe tip 27. Probe tip 27 includes an elongate tip 28, a threaded sleeve 29, a distal tip thread 30, and a proximate tip thread 31. Threaded sleeve 29 engages a distal tip thread 30 and proximate tip thread 31 engages a distal sleeve thread 32 of probe tip sleeve 26. Probe tip 27 is constructed of a highly conductive material, for example, nickel-plated brass, and probe tip sleeve 26 is constructed of a nonconductive material, for example, ABS plastic. Probe tip 27 is electrically connected to a center conductor 34 through a wire 36 and a first surface mount resistor 40, for example, by soldering. Wire 36 may be, for example, 30 gauge copper wire. Probe tip 27 and center conductor 34 are generally electrically isolated from an outer conductor shield 38 which circumscribes center conductor 34; however, the termination resistive input network is electrically connected between center conductor 34 and outer conductor shield 38.

The resistive input network includes first surface mount resistor 40, for example a 475 ohm surface mount resistor, which is electrically coupled in series between conductive probe tip 27 and center conductor 34 of probe end connector 50. Additionally, one or more SMD resistors may be electrically connected between center conductor 34 and outer conductive shield 38 of probe end connector 50. For example, two 100 ohm resistors, first and second surface mount resistors 42 and 44, may be electrically coupled in parallel between center conductor 34 and the outer conductive probe body, which includes outer conductive shield 38, providing appropriate termination for 50 ohm matched impedance components. The combination of the 475 ohm first surface mount resistor 40 with the two 100 ohm first and second surface mount resistors 42 and 44 provides a probe attenuation factor of approximately 20×; however, other factors may be achieved with values other than 475 ohms. Additionally, other resistor values may be used for first and second surface mount resistors 42 and 44 to provide a matched impedance value other than 50 ohms.

The electrical connections between surface mount resistors 40, 42 and 44 and probe tip 27 and conductor 34 and shield 38 may be, for example, a soldered connection 41. Additionally, resistors 40, 42 and 44 may also be glued, for example epoxyed, in place within outer conductor shield 38 of probe end connector 50. Depending on fit, resistors 42 and 44 may also be canted at an angle between center conductor 34 and shield 38. Advantageously, using surface mount resistors for providing input termination at the distal termination of coaxial shielding in a balanced electrical probe pair minimizes parasitic inductance and capacitance, thereby improving response characteristics over a wide frequency range.

The exemplary probe end 25 includes male BNC connector 58 and oppositely located probe end connector 50 having female SMA adapter 56 forming a portion of outer conductor shield 38 and center conductor 34. Center conductor 34 in the exemplary embodiment is a hollow cylindrical pin. Insulator 37 may be located between center conductor 34 and outer conductor shield 38. In the exemplary embodiment, resistors 42 and 44 rest against insulator 37. Probe end connector 50 may be, for example, Part No. 16N2740, manufactured by SPC Technology of Chicago, Ill. Probe tip sleeve 26 and probe tip 27 may be, for example, Part No. 35N776, manufactured by SPC Technology, Inc.

Assembly of probe tip 27 and probe end connector 50 is facilitated by a non-conductive structure, probe tip sleeve 26. Sleeve 26 is secured internally at opposite ends with proximate sleeve thread 33 engaging female SMA adaptor 56 and distal sleeve thread 32 engaging proximate tip thread 31. Alternatively, a different or additional fastening structure may be used, for example, epoxy. Wire 36 transits the hollow interior of sleeve 26 and couples resistor 40 and probe tip 27.

Referring to FIG. 2B, each probe 12 may include a plurality of commercially available connectors and adapters that each form a portion of probe body 24, are impedance matched, and conduct and shield the electrical signal received at elongate tip 28. Specifically, probe body 24 may include coaxial BNC type connectors 50, 52 and 54 for coupling probe end 25 with base connector 15. Connectors 50, 52 and 54 may be constructed primarily of a conductive material such as nickel-plated brass and are impedance matched, for example, 50 ohms.

BNC connector 52 may include female BNC adapter 60 and 62 at opposite ends, for example, Part No. 20C3275, manufactured by SPC Technology. Female adapter 60 of BNC connector 52 may be coupled with male adapter 58 of BNC connector 50. BNC connector 54 may include male BNC adapters 64 and 66 at opposite ends, for example, Part No. 20C3274, manufactured by SPC Technology. Male adapter 64 of BNC connector 54 may be coupled with female adapter 62 of BNC connector 52.

Finally, base connector 15 may be, for example, an RF bulkhead adapter, such as Part No. 93F1409, available from Amphenol, of Wallingford, Conn. Exemplary base connector 15 includes female BNC adapters 68 and 70 at opposite ends. Female adapter 68 of base connector 15 may be coupled to male adapter 66 of BNC connector 54. Alternatively, types of low cost impedance matched components that minimize parasitic capacitance and inductance may be substituted for connectors 15, 50, 52, and 54.

Probe 12 may also include body sleeve 13, for example, a 3⁄1;4-inch long and ½ ID metal pipe such as copper which, as shown in FIG. 2A, may be securely received over connectors 15, 50, 52 and 54. Body sleeve 13 provides an outer conductive shield as well as structural rigidity and a smooth cylindrical shape for probe body 24. The increased diameter of probe body 24 formed by sleeve 13 minimizes parasitic capacitance introduced by a user's hand holding probe 12. Probe body 24 may also be insulated, for example by nonconductive heat shrink or another suitable material or coating.

Referring to FIG. 3, coaxial cables 14, for example Part No. RG-223, available from Alpha Wire of Elizabeth, N.J., may be used to couple probes 12 to combiner 20, or to an input port of measurement device 18. Cables 14 may include male BNC adapter 72 for coupling to female BNC adapter 70 of probe 12 and female BNC adapter 73 of combiner 20 or input channel connector 22. Alternatively, other suitable connectors may be used at opposite ends. It is very important that probes 12 and cables 14 be virtually the same materials and dimensions in order to provide proper electrical balancing of the electrical characteristics of probe pair assembly 10. Variations between probes 12 or cables 14 may cause phase errors, signal amplitude errors, and other electrical errors in the measured signal. Between opposite ends of cables 14, the insulative coating around the outside coaxial sheath of cables 14 may be stripped away and the exposed outer shielding conductor can be electrically coupled at adjacent locations, for example, at junctions 75, periodically along the cable length, for example every 3 inches. The central but substantial portion of cables 14 may then be insulated with shrink-wrap 74, or another suitable insulating material, for insulating solder junctions 75 therealong.

The balanced probe pair assembly may be coupled to combiner 20 or another suitable input device of signal analysis device 18. As shown in FIG. 3, combiner 20 is coupled with input channel connector 22, thereby providing a differential input of the circuit nodes probed by probes 12 of balanced probe pair assembly 10. Although ground connector 16 may be included with probe pair assembly 10, ground connector 16 would generally only be utilized for single probe measurements, very high common-mode voltage measurements, for example, electrostatic discharge testing, or other similarly indicated measurement circumstances.

Figure 4A:
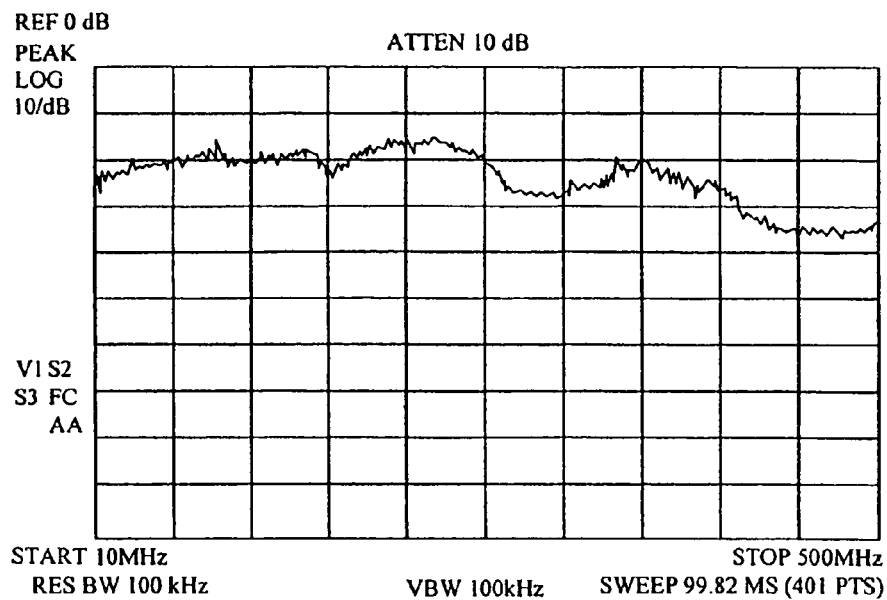
FIG. 4A is a graphic illustration of the 10 MHz to 500 MHz frequency response of a typical commercially available balanced probe pair.
Figure 4B:
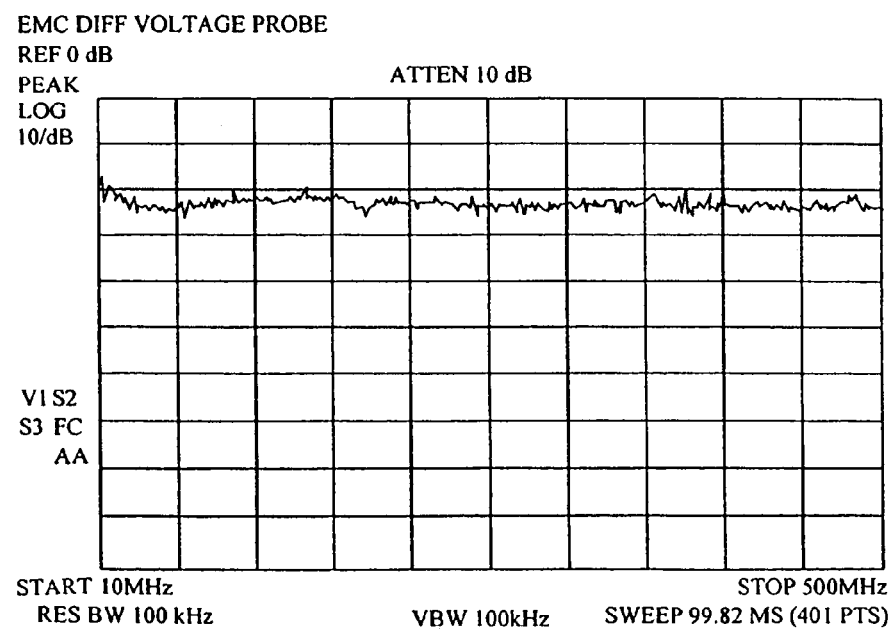
FIG. 4B is a graphic illustration of the 10 MHz to 500 MHz frequency response of a balanced probe pair according to the present invention.
Figure 4C:
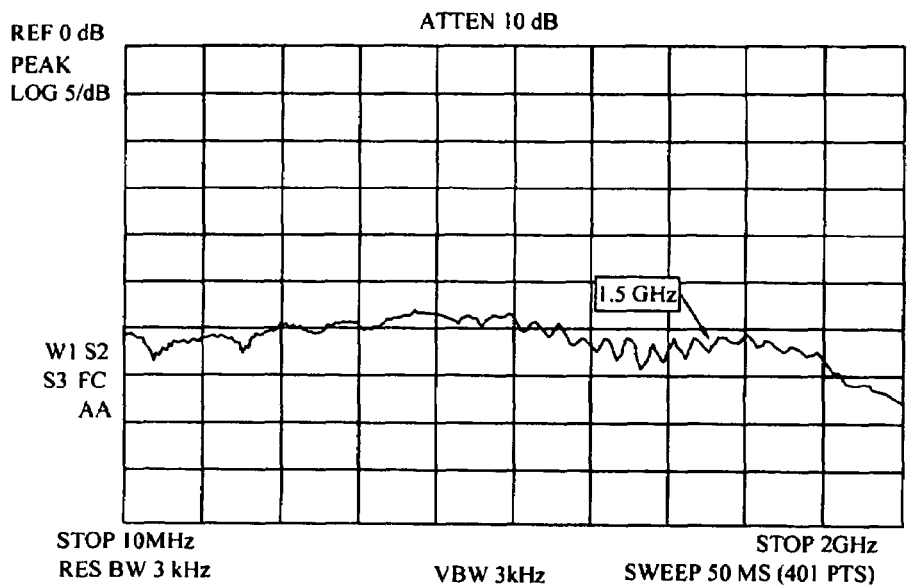
FIG. 4C is a graphic illustration of the 10 MHz to 2 GHz frequency response of a balanced probe pair according to the present invention.
Figure 4D:
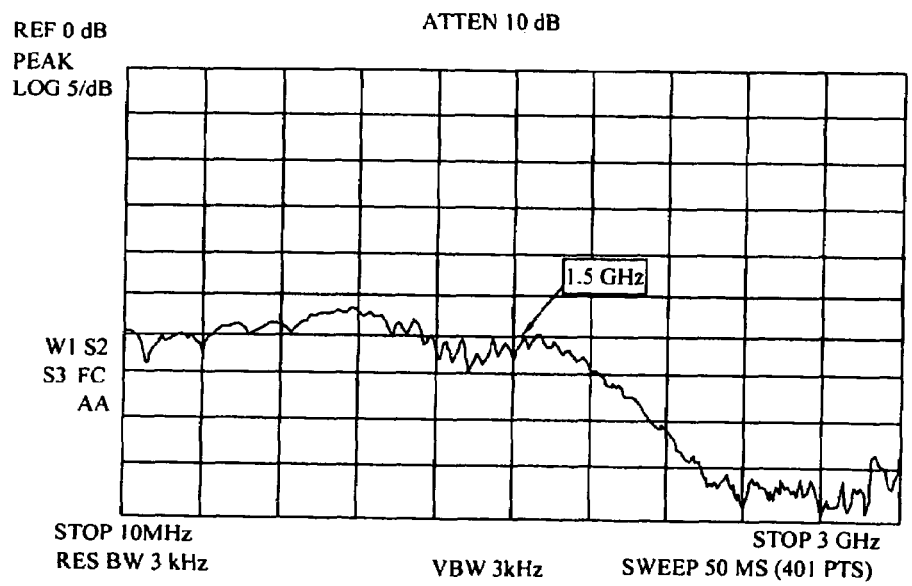
FIG. 4D is a graphic illustration of the 10 MHz to 3 GHz frequency response of a balanced probe pair according to the present invention.

Referring to FIG. 4A, a typical frequency response for a commercially available balanced probe pair is shown for the purposes of comparison with FIG. 4B, which under the same test conditions and illustrative chart display shows the much flatter response of the lower-cost inventive balanced probe pair assembly 10. The frequency range for FIGS. 4A and 4B is 10 MHz to 500 MHz and the attenuation setting is 10 dB. FIGS. 4C and 4D also demonstrate the performance of probe pair assembly 10. FIG. 4C illustrates 10 MHz to 2 GHz for 30 dB and FIG. 4D illustrates 10 MHz to 3 GHz for 30 dB. FIGS. 4B–4D illustrate that probe pair assembly 10 has a flatter response characteristic up to at least 1.5 GHz than prior art probes.

Although described in the exemplary embodiments, it will be understood that various modifications may be made to the subject matter without departing from the intended and proper scope of the invention. Accordingly, it will be understood that other embodiments may fall within the scope of this invention, which is defined by the appended claims.

What is claimed is:

1. A passive test probe apparatus for use with a signal analysis device, comprising:
   a conductive probe body;
   a conductive probe tip supported by and protruding from said probe body;
   a hollow cylindrical center conductor supported by and substantially electrically insulated from said probe body;
   a first surface mount resistor electrically connected between said probe tip and said center conductor;
   an outer conductive shield coupled to said probe body, said outer conductive shield being insulated from said probe tip and said center conductor; and
   at least one second surface mount resistor electrically connected between said center conductor and said probe body adjacent a distal end of said probe body, said at least one second surface mount resistor being soldered to an outer surface of said hollow cylindrical center conductor.

2. The passive test probe apparatus of claim 1, wherein said first surface mount resistor is approximately 475 ohms.

3. The passive test probe apparatus of claim 1, wherein said first surface mount resistor and said at least one second surface mount resistor are directly connected to said center conductor.

4. The passive test probe apparatus of claim 3, wherein said first surface mount resistor and said at least one second surface mount resistor are glued to said probe body.

5. The passive test probe apparatus of claim 4, wherein said outer conductive shield is insulated from said center conductor by an insulator, said at least one second surface mount resistor resting against said insulator.

6. The passive test probe apparatus of claim 1, wherein said conductive probe body and said center conductor include a coaxial connector having an inner conductor and an outer conductor, said inner conductor forming said center conductor and said outer conductor forming said outer conductive shield.

7. The passive test probe apparatus of claim 6, further comprising a probe tip housing having a substantially cylindrical nonconductive sleeve coupling said probe body to said probe tip.

8. The passive test probe apparatus of claim 7, further comprising a conductive wire within said probe tip housing, said wire coupling said probe tip and said first surface mount resistor.

9. The passive test probe apparatus of claim 6, wherein said conductive shield includes a metal tube located coaxially around said at least one coaxial connector.

10. The passive test probe of claim 6, wherein said at least one second surface mount resistor forms an impedance match resistive termination for said coaxial connector.

11. A balanced test probe apparatus, comprising:
a first probe having a first surface mount resistor electrically connected between a first probe tip and a first center conductor, said first probe including a first conductive outer shield coaxially located with said first center conductor;
a first coaxial cable electrically connected to said first probe at a first end;
a second probe having a second surface mount resistor connected between a second probe tip and a second center conductor, said second probe including a second conductive outer shield coaxially located with said second center conductor, said first conductive outer shield and said second conductive outer shield being electrically coupled at intervals substantially along the entire length; and
a second coaxial cable of substantially equal length with said first coaxial cable, said second coaxial cable electrically connected to said second probe at a second end;
said second surface mount resistor having a resistance value equal to said first surface mount resistor;
said first probe including at least one third surface mount resistor electrically connected between said first center conductor and a distal end of said first outer shield; and
said second probe including at least one fourth surface mount resistor electrically connected between said second center conductor and a distal end of said second outer shield.

12. The balance test probe apparatus of claim 11, wherein said at least one third and at least one fourth surface mount resistor each has a total resistance providing impedance match resistive termination for said first and second coaxial cables.

13. The balance test probe apparatus of claim 11, further comprising:
a first outside conductive shield coaxially coupled around said first probe body, said first outside shield insulated from said first probe tip and said first center conductor; and
a second outside conductive shield coaxially coupled around said second probe body, said second outside shield insulated from said second probe tip and said second center conductor.

14. The balanced test probe apparatus of claim 11, wherein said first and second probes each include a plurality of coaxial connectors' impedance matched with said first and second coaxial cables.

15. A passive test probe apparatus for use with a signal analysis device, comprising:
a probe body;
a conductive probe tip supported by and axially protruding from said probe body;
a center conductor supported by said probe body;
a first surface mount resistor electrically connected between said probe tip and said center conductor;
an outer conductive shield coupled to said probe body, said outer conductive shield insulated from said probe tip and said center conductor; and
second and a third surface mount resistors electrically connected in parallel between said center conductor and a distal end of said outer conductive shield.

16. The passive test probe apparatus of claim 15, further comprising a coaxial cable having an inner conductor and an outer conductor, said inner conductor electrically connected to said center conductor and said outer conductor electrically connected to said outer conductive shield.

17. The passive test probe apparatus of claim 16, wherein said probe body comprises a probe tip housing having a substantially cylindrical nonconductive sleeve supporting said probe tip.

18. The passive test probe apparatus of claim 15, wherein said probe body and said center conductor comprise a plurality of impedance matched coaxial adapters.

19. A passive test probe apparatus for use with a signal analysis device, comprising:
a conductive probe body;
a conductive probe tip supported by and protruding from said probe body;
a center conductor supported by and substantially electrically insulated from said probe body;
an outer conductive shield coupled to said probe body, said outer conductive shield being insulated from said probe tip and said center conductor;
a first surface mount resistor electrically connected between said probe tip and said center conductor; and
two 100 ohm second surface mount resistors electrically connected in parallel between said center conductor and said probe body adjacent a distal end of said probe body.

* * * * *